United States Patent [19]

Lucas et al.

[11] 4,304,988

[45] Dec. 8, 1981

[54] BATTERY POWERED ELECTRONIC COUNTER

[75] Inventors: Richard K. Lucas; Robert Kozak, both of Enfield, Conn.

[73] Assignee: Veeder Industries Inc., Hartford, Conn.

[21] Appl. No.: 62,346

[22] Filed: Jul. 31, 1979

[51] Int. Cl.³ ............... H03K 21/06; H03K 21/32
[52] U.S. Cl. ............... 235/92 DE; 235/92 MS; 235/92 FP; 328/48
[58] Field of Search ....... 235/92 DE, 92 EC, 92 MS, 235/92 FP, 92 V, 92 R, 144 E; 328/48; 307/220 R

[56] References Cited

U.S. PATENT DOCUMENTS

| | | | |
|---|---|---|---|
| 2,808,535 | 10/1957 | Lee | 328/48 |
| 3,666,928 | 5/1972 | Burke et al. | 235/92 DE |
| 3,777,121 | 12/1973 | Jamieson | 235/92 MS |
| 3,846,624 | 11/1974 | Kawanabe | 235/92 MS |
| 3,946,210 | 3/1976 | Fleischer | 235/92 DE |
| 3,983,373 | 9/1976 | Russell | 235/92 V |
| 3,994,419 | 11/1976 | Sasnett et al. | 235/92 V |
| 4,016,407 | 4/1977 | Mesecar et al. | 235/92 DE |

*Primary Examiner*—Joseph M. Thesz
*Attorney, Agent, or Firm*—Prutzman, Kalb, Chilton & Alix

[57] ABSTRACT

A battery powered electronic counter with an electronic accumulator (12), a switch (22) for resetting the accumulator (12) and disconnecting the battery (20), and an accumulator indexing circuit with a first pair of switch input terminals (28) having separate high and low impedance connections to the battery (2) for minimizing battery drain and reducing input signal noise sensitivity, a second pair of AC/DC input terminals (30) for receiving an input pulse of up to 250 volts and a transistor circuit with a transistor (74) and a resistor (76) for limiting the current through an optical isolator (68) for the AC/DC terminals (30).

5 Claims, 1 Drawing Figure

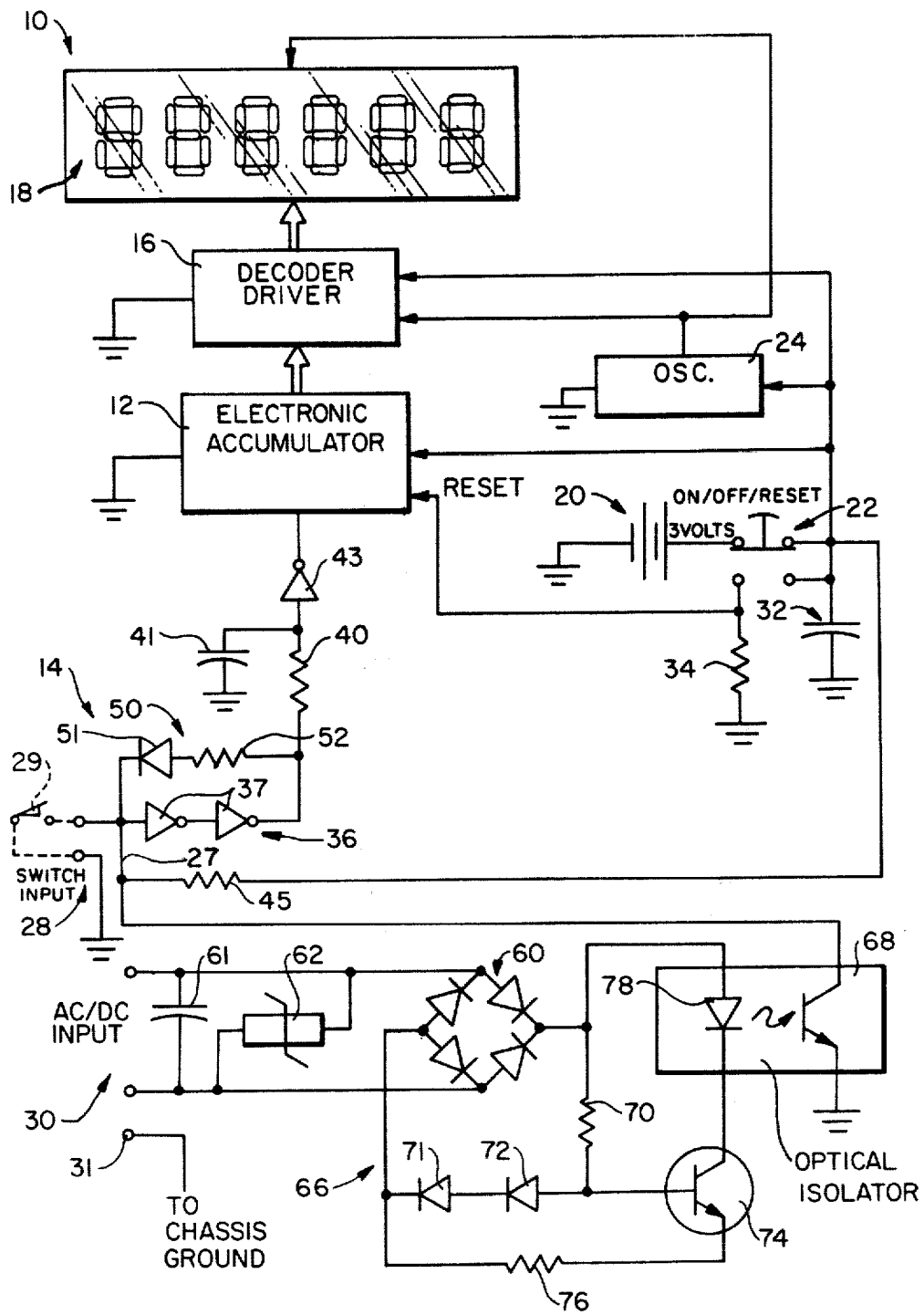

BATTERY POWERED ELECTRONIC COUNTER

TECHNICAL FIELD

The present invention relates generally to electronic counters and more particularly to a new and improved battery powered electronic counter having notable utility with a liquid crystal display.

DISCLOSURE OF INVENTION

It is a primary aim of the present invention to provide a new and improved battery powered electronic counter having an exceedingly long shelf and operating life.

It is another aim of the present invention to provide a new and improved battery powered electronic counter useful in numerous applications. In accordance with one embodiment of the present invention, the battery powered electronic counter may be connected to be indexed by a switch without external power, and in accordance with another embodiment of the present invention, the battery powered electronic counter may be connected to be indexed by an AC or DC pulse within a wide AC/DC voltage range.

It is a further aim of the present invention to provide in a battery powered electronic counter, a new and improved switch circuit for resetting the counter and disconnecting the battery.

It is another aim of the present invention to provide a new and improved battery powered electronic counter having relatively good immunity to input signal noise and requiring very little battery power.

It is another aim of the present invention to provide a new and improved battery powered electronic counter operable by an input pulse within a wide voltage range and having an optical isolator and a constant current optical isolator operating circuit for isolating the counter circuitry against damage by a high voltage input pulse.

Other objects will be in part obvious and in part pointed out more in detail hereinafter.

A better understanding of the invention will be obtained from the following detailed description and the accompanying drawing of an illustrative application of the invention.

BRIEF DESCRIPTION OF THE DRAWING

The drawing shows a generally schematic view of an embodiment of a battery powered electronic counter of the present invention.

BEST MODE FOR CARRYING OUT THE INVENTION

Referring now to the drawing in detail, an embodiment 10 of a battery powered electronic counter of the present invention comprises a suitable electronic accumulator 12 having an input circuit 14, hereinafter described, connected for indexing the electronic accumulator 12 for each applied input or count signal. The electronic accumulator 12 is connected via a suitable decoder-driver 16 for operating a liquid crystal indicator 18 for displaying the accumulated count of the electronic accumulator 12. The liquid crystal indicator 18 is shown employing six seven-bar numeral displays or digits for displaying any accumulated count from 000000 to 999999.

A battery 20 is connected via an on/off/reset switch 22 for supplying battery power to the electronic accumulator 12 and decoder-driver 16. Also, the battery 20 is connected for supplying battery power to a suitable oscillator 24 for AC operation of the liquid crystal indicator 18 in a known manner. Preferably, the battery 20 is a high performance battery such as a lithium battery sold under the trademark Eternacell by Power Conversion, Inc. For example, a model 440-S Eternacell battery having a 1.0 ampere-hour rated capacity may be used and in that event the electronic counter 10 in accordance with the present invention has a combined shelf life and operational life of probably ten years or more.

The electronic counter 10 is preferably constructed as a small and compact module and so that the counter module 10 can be conveniently and readily used in numerous applications and at any desired location which is either close to a count signal source or which provides convenient reading for data handling purposes.

The counter module 10 is shown employing two sets of input terminals 28, 30 respectively. The pair of terminals 28 is adapted to be connected to an external switch (such as the external switch 29 shown in broken lines in the drawing) to provide a battery ground input signal for indexing the electronic accumulator 12. The pair of AC/DC input terminals 30 (and a chassis ground terminal 31 providing for grounding the counter chassis) are employed for applying AC/DC input signals to the terminals 30 for indexing the electronic accumulator 12. Also, it is contemplated for simplicity of use and operation of the electronic counter 10, that two different embodiments of the counter be employed with one embodiment having only the switch input terminals 28 and the other embodiment having only the AC/DC input terminals 30 (and the respective ground safety terminal 31).

The on/off/reset switch 22 is shown in the drawing in its normal or operating position for connecting the battery 20 for supplying power to the counter circuitry. The on/off/reset switch 22 which is shown is a conventional push button switch and when pressed connects a storage capacitor 32 to a reset input of the electronic accumulator 12 for resetting the accumulator. The push button switch 22 can then be released for reconnecting the battery 20 to the counter circuitry for normal operation. The reset input to the electronic accumulator 12 is connected to battery ground via a suitable resistor 34 to de-energize the reset input and thereby permit the electronic accumulator 12 to accumulate a new count when the push button switch 22 is released.

It can be seen that the push button switch 22 can be held in a depressed or actuated position to maintain the battery 20 disconnected. Accordingly, the two position switch 22 provides a counter reset function and a battery disconnect function in its depressed position. The switch 22 can be held in that position by a tape, rubber band or other mechanical device while the electronic counter 10 is not in use to extend the useful life of the battery 20, and for example to extend the life of a high performance lithium battery to ten years or more. If desired, a suitable toggle switch or the like (not shown) could be employed in place of the push button switch 22 to avoid the need for holding the switch in its battery off position.

The switch input terminals 28 are connected for indexing the electronic accumulator 12 by momentarily grounding a conductor 27 of the indexing circuit 14.

The conductor 27 is connected between the battery 20 and accumulator 12 and in series with an isolating circuit 36 having a pair of series connected CMOS inverters 37, a filter comprising a resistor 40 and a capacitor 41 and an inverter 43. When the external switch 29 is closed, a logic 0 is applied to the isolating circuit 36 and a logic 1 is applied to the electronic accumulator 12 for indexing the accumulator. When the switch 29 is reopened, a logic 1 is applied to the isolating circuit 36 by the battery 20 and via a resistor 45, and the electronic accumulator input is thereby switched to logic 0. The resistor 45 has a relatively high impedance (e.g. one million ohms) to reduce the battery drain when the external switch 29 is closed. When the external switch 29 is open, a relatively low impedance connection to the switch input conductor 27 is provided to prevent noise generated operation of the electronic accumulator 12. For that purpose, a relatively low impedance feedback circuit 50 is employed, in accordance with the present invention, which bridges the isolation circuit 36. The feedback circuit 50 comprises a diode 51 and a relatively low impedance resistor 52 (e.g. having ten thousand ohms) to help bias or maintain the input conductor 27 at logic 1 when the external switch 29 is open and thereby substantially reduce the input circuit sensitivity to noise.

The AC/DC input terminals 30 are connected to a full wave diode bridge rectifier 60 to supply a DC output signal for indexing the electronic counter 12 when an AC or DC pulse is applied to the input terminals 30. A suitable capacitor 61 and varistor 62 are connected between the input terminals 30 to limit the maximum operating voltage for example to 250 volts. As described hereinafter, a bridge output circuit 66 is employed for operating an LED optical isolator switch 68 for each AC/DC input pulse applied to the terminals 30 within a wide voltage range, for example between 6 volts and the established maximum operating voltage (e.g. 250 volts). Accordingly, the AC/DC input terminals 30 can be directly connected for receiving counter indexing pulses from a large variety of applications without requiring additional modifying or protective circuitry.

The bridge output circuit 66 comprises a primary output loop which includes a suitable high resistance resistor 70 of for example 150,000 ohms and a pair of diodes 71, 72. The pair of diodes 71, 72 establish a voltage drop of approximately 1.2 volts across a secondary circuit which bridges the pair of diodes 71, 72 and which comprises an NPN transistor 74 and a resistor 76. Also, in the secondary circuit, there is a voltage drop of approximately 0.6 volt between the base and collector of the transistor and therefore a remaining voltage drop of approximately 0.6 volt across the resistor 76. The resistance of resistor 76 is established at for example 330 ohms to provide a resistor current of approximately equal to but less than 2 milliamps. The transistor 74 thereby provides for limiting the current through a light emitting diode (LED) 78 of the optical isolator 68 to approximately but less than 2 milliamps when an AC/DC signal is applied to the AC/DC input terminals 30. Accordingly the transistor switch 74 provides for establishing the current through the LED diode 78 for each AC/DC pulse applied to the terminals 30 and wherein the LED current and therefore the input current to terminals 30 are substantially independent of the applied signal voltage. When the LED 78 is energized, the optical isolator 68 connects the input conductor 27 to battery ground to index the accumulator 12.

Thus, it can be seen that the electronic counter module 10 of the present invention is operable by an external switch input signal or an AC/DC pulse input signal within a wide voltage range. A high impedance battery connection is employed for minimizing battery drain when a count signal is applied and a low impedance feedback circuit is employed for minimizing the sensitivity of the electronic counter to input signal noise. Also, a single on/off/reset switch 22 is employed for resetting the electronic accumulator 12 when desired and for disconnecting the battery 20, for example when the electronic counter module 10 is not in use.

As will be apparent to persons skilled in the art, various modifications, adaptations and variations of the foregoing specific disclosure can be made without departing from the teachings of the present invention.

We claim:

1. In a battery powered electronic counter having a battery, an electronic accumulator adapted to be indexed for accumulating a count, indexing circuit means having input terminal means and connected to the battery and accumulator for indexing the accumulator upon the application of a predetermined count signal to the input terminal means, the improvement wherein the input terminal means comprises a switch input terminal and wherein the indexing circuit means is operable for indexing the accumulator upon the momentary application of a switch input signal of one battery polarity to the switch input terminal, the indexing circuit means comprising a first relatively high impedance connection for applying the opposite battery polarity to the switch input terminal, an isolation circuit isolating said switch input terminal from the electronic accumulator, and relatively low impedance feedback circuit means connected to the switch input terminal to provide a second connection for applying said opposite battery polarity to said switch input terminal and having a substantially lower impedance than said first connection to substantially reduce input signal noise sensitivity when the switch input terminal is at said opposite battery polarity, the feedback circuit means being nonconductive when the switch input terminal is at said one battery polarity.

2. An electronic counter according to claim 1 wherein said first relatively high impedance connection comprises a first relatively high resistance resistor and wherein said relatively low impedance feedback circuit comprises a second resistor having substantially lower resistance than said first resistor.

3. In a battery powered electronic counter having a battery, an electronic accumulator adapted to be indexed for accumulating a count, indexing circuit means having input terminal means and connected to the battery and accumulator for indexing the accumulator upon the application of a predetermined count signal to the input terminal means, and indicator means connected to the accumulator for displaying its accumulated count, the improvement wherein the indexing circuit means comprises input circuit means for receiving an input signal pulse applied to the terminal means having a voltage within a wide voltage range, the input circuit means comprising a solid state optical isolator for isolating a said input signal pulse applied to the terminal means and connected to be operated by a said input signal pulse for indexing the accumulator, a primary circuit for receiving a said input signal pulse and having first resistor means and separate diode means in series connection, and a current control circuit bridging the diode means comprising a control transistor and second resistor means, the control transistor having a base terminal connected to the primary circuit to establish with the diode means a generally fixed maximum voltage drop across the current control circuit, the control transistor having a second terminal connected to the second resistor means to limit the current in the control circuit in accordance with said voltage drop, and the control transistor having a third terminal connected to the optical isolator to conduct current through the optical isolator via the transistor and the second resistor means of the current control circuit.

4. An electronic counter according to claim 3 wherein the terminal means comprises a switch input terminal and wherein the indexing circuit means is operable for indexing the accumulator upon the application to the switch input terminal of a count signal of one battery polarity, the indexing circuit means comprising a first relatively high impedance connection for applying the opposite battery polarity to the switch input terminal, an isolation circuit isolating the switch input terminal from the electronic accumulator, and relatively low impedance feedback circuit means bridging the isolation circuit, the feedback circuit means being connected to the switch input terminal to provide a second connection for applying said opposite battery polarity to the switch input terminal and having a substantially lower impedance than said first connection to substantially reduce input signal noise sensitivity when the switch input terminal is at said opposite battery polarity the feedback circuit being nonconductive when the switch terminal is at said one battery polarity.

5. An electronic counter according to claim 4 wherein said isolation circuit comprises CMOS inverter means.

* * * * *